United States Patent
Xu et al.

(10) Patent No.: US 11,784,084 B2
(45) Date of Patent: Oct. 10, 2023

(54) HIGH PRECISION AIR BEARING STAGE WITH CAPABILITY OF PARASITIC ERROR COMPENSATION

(71) Applicant: SANYING MOTIONCONTORL(TIANJIN) INSTRUMENT CO., LTD., Tianjin (CN)

(72) Inventors: Ying Xu, Tianjin (CN); Hao Liu, Tianjin (CN); Jing Jia, Tianjin (CN)

(73) Assignee: SANYING MOTIONCONTORL(TIANJIN) INSTRUMENT CO., LTD., Tianjin (CN)

( * ) Notice: Subject to any disclaimer, the term of this patent is extended or adjusted under 35 U.S.C. 154(b) by 99 days.

(21) Appl. No.: 17/668,425

(22) Filed: Feb. 10, 2022

(65) Prior Publication Data

US 2023/0163016 A1    May 25, 2023

(30) Foreign Application Priority Data

Nov. 19, 2021   (CN) .......................... 202111374217.5

(51) Int. Cl.
| | |
|---|---|
| *H01L 21/683* | (2006.01) |
| *B25B 11/00* | (2006.01) |
| *F16C 32/06* | (2006.01) |
| *G01B 21/22* | (2006.01) |
| *H01L 21/67* | (2006.01) |

(52) U.S. Cl.
CPC ........ *H01L 21/6838* (2013.01); *B25B 11/005* (2013.01); *F16C 32/0603* (2013.01); *G01B 21/22* (2013.01); *H01L 21/67259* (2013.01)

(58) Field of Classification Search
CPC ....... B25B 11/00; B25B 11/005; B25B 11/02; B23Q 3/00; B23Q 3/06; H01L 21/6838; F16C 32/0603; G01B 21/22
USPC ......................................... 269/21, 55, 59, 60
See application file for complete search history.

(56) References Cited

U.S. PATENT DOCUMENTS

| | | | |
|---|---|---|---|
| 10,197,871 B2 | 2/2019 | Sasaki | |
| 2007/0152391 A1* | 7/2007 | Chitayat | .................. B23Q 1/58 269/55 |
| 2018/0067397 A1* | 3/2018 | Aoki | ................... G03F 7/70775 |

FOREIGN PATENT DOCUMENTS

| | | |
|---|---|---|
| CN | 102435928 A | 5/2012 |
| CN | 102928761 A | 2/2013 |

* cited by examiner

*Primary Examiner* — Lee D Wilson
*Assistant Examiner* — Alberto Saenz

(57) ABSTRACT

A high precision air bearing stage for wafer inspection and a method of runout errors detecting and compensating. The air bearing stage includes a base block, a crossbeam mounted on the base block, a sliding table configured to carry a compensation stage, a motor and a grating ruler used to drive the sliding table to move along the crossbeam, sensors used for monitoring the position of the sliding table in real time, air-bearing used for supporting the sliding table, and a compensation stage configured to compensate the runout errors of the air bearing stage based on the real-time detecting data from the sensors. The air-bearing includes a first air-bearing, a second air-bearing and a third air-bearing.

10 Claims, 8 Drawing Sheets

HIGH PRECISION AIR BEARING STAGE WITH CAPABILITY OF PARASITIC ERROR COMPENSATION

CROSS REFERENCE TO RELATED APPLICATIONS

This application claims foreign priority of Chinese Patent Application No. 202111374217.5, filed on Nov. 19, 2021 in the China National Intellectual Property Administration, the disclosures of all of which are hereby incorporated by reference.

TECHNICAL FIELD

The invention relates to an air bearing stage for wafer inspection. In particular the stage is of high precision of motion control in moving axis with the capability of parasitic error detection and compensation in other axes.

BACKGROUND OF THE INVENTION

Chips are an essential part of a computer or other electronic devices, which are fabricated from silicon wafers. The manufacturing process of chips is extremely complex and precise. Among the processes, lithography, wafer inspection, wafer cutting, and wafer packaging have high requirements on the accuracy, speed, and displacement resolution of the motion stage. The air bearing stage is a good candidate for the applications due to its frictionless motion characteristic.

For an air bearing stage design, normally exists three types of guiding structures: a) two-axis stacking type; b) planar type; c) single-axis type. For example, the Chinese Patent of Application No. CN201710832517.0 discloses a motion stage based on an H-type air bearing guide, which belong to a two-axis planar type. The guiding accuracy of the air bearing stage mainly depends on the flatness of the sliding surfaces. Based on the current level of precision machining, the surface flatness of 1 m² of granite can reach 2 microns, and the parallelism and perpendicularity of other surfaces can also reach the micron scale. Therefore, the motion straightness/flatness of the air bearing stage can reach 200 nm/500 mm. Due to the current level of mechanical processing, it is difficult to further improve the motion straightness/flatness. In addition, the motion straightness/flatness of the air bearing stage will be affected by the instability and the limited stiffness of the air film and the inertial force of moving parts as well. The current technology of air bearing stage is hard to meet the needs of the nanoscale wafer inspection.

SUMMARY OF THE INVENTION

The purpose of the present invention is to provide a new air bearing stage with capability of compensating the runout errors of the air bearing stage for wafer inspection application. The technical scheme adopted by the present inventions is:

A high precision air bearing stage for wafer inspection, including:

A base block used as a seat of the air bearing stage;

A crossbeam installed on the base block;

A sliding table that can slide along the crossbeam, and the top of the sliding table can be used to place a nano-compensation stage and a vacuum chuck on the top;

A linear motor and a grating ruler used to drive the sliding table to slide along the crossbeam;

Three sensors are distributed on sides of the sliding table to measure the runout errors of the air bearing stage;

There are three air bearings namely first air bearing, second air bearing and third air bearing; the first air bearing and the second air bearing are used as the horizontal constraints of the sliding table, and the third air bearing are used as the vertical floating support of the sliding table;

A compensation stage is located on the sliding table, and it is used to compensate the runout errors of the air bearing stage based on a real-time error data detected by the sensors.

A high precision plane is used as a reference plane for runout error measurement. A sensor measures the runout error of the air bearing stage by detecting the relative position change between the sensor and reference surface.

Further, the precision plane is mounted on the first mounting seat, and the first mounting seat is fixed on the base block; the air bearing stage comprises two sets of the precision plane and the first mounting seat; one set of the precision plane and the first mounting seat is located on one side of the sliding table, and another set of the precision plane and the first mounting seat is located on another side of the sliding table.

Further, the high precision air bearing stage consists of two second mounting seats; the two second mounting seats are respectively fixed on two sides of the sliding table; and the sensors comprise a first sensor, a second sensor and a third sensor; the first sensor is installed on one second mounting seat on one side of the sliding table, and the second sensor and the third sensor are both installed on another second mounting seat on another side of the sliding table.

Further, a nano-compensation stage is placed on the top of the sliding table, the vacuum chucks is placed on the nano-compensation stage, a wafer to be inspected is placed on the vacuum chucks. The wafer can be moved linearly by the air bearing stage.

Further, the high precision air bearing stage includes two dampers and baffles; wherein the baffles are located on each side of the crossbeam and is used as end covers, and the two dampers are arranged at the inner side of the baffles as hard stops to sliding table.

According to one of the technical solutions of the present invention, the sliding table is supported by air bearings. The first air bearing and the second air bearing can be used to constrain the sliding table in the horizontal direction, and the third air bearing is used to support the sliding table in the vertical direction. The air bearing stage has frictionless motion characteristic, which is convenient for high precision motion control.

According to the second technical solution of the present invention, the sensors detect the runout errors of the air bearing stage in real-time. The precision of the sensors in the present invention are of nanometer level, so the runout errors of air bearing stage can be detected at the nanometer level.

According to the third technical solution of the present invention, the compensation stage can actively compensates the runout errors of the air bearing stage, which can eliminate the influence of the runout errors on the wafer inspection during the motion of the air bearing stage, and greatly improves the wafer inspection accuracy.

According to the fourth technical solution of the present invention, the air bearing stage of the present invention consists of a high precision measurement reference plane, such as a flat crystal. the upper surface of the flat crystal is used as the measurement reference plane. The sensor is preferably a capacitive sensor. Considering the fact that the runout error at a certain point on the wafer is composed of the Z-direction error and the pitch and roll errors, the system uses 3 sensors, and the precision of the capacitive sensors can reach nanometers. Therefore, the runout errors of the air bearing stage of the present invention can be controlled at nanometer-level.

Figure 1:
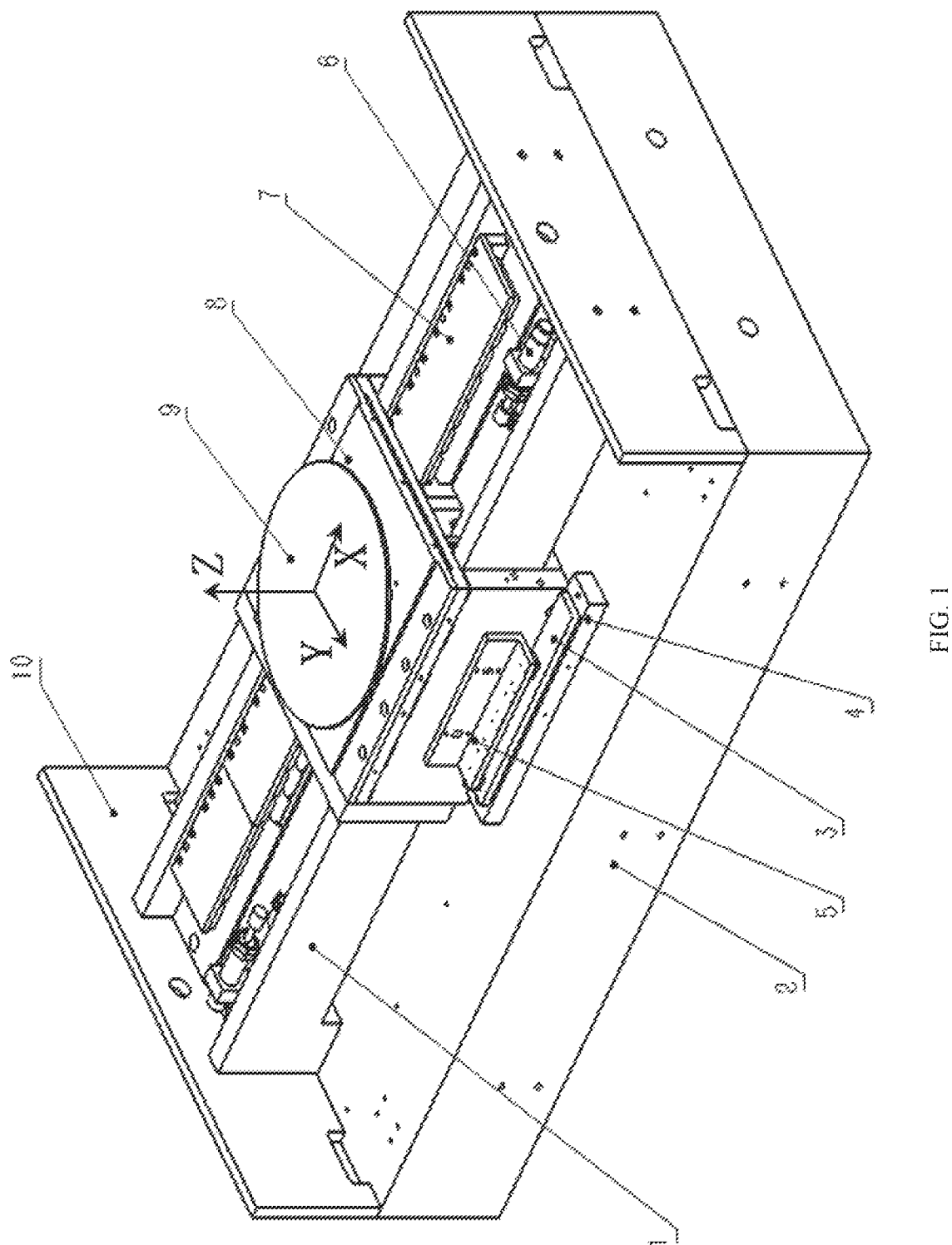
FIG. 1 is a perspective view of an air bearing stage according to an embodiment of the present invention.

In the figures, crossbeam 1, base block 2, high precision plane 3, flat crystal mount 4, sensor mount 5, damper 6, linear motor 7, sliding table 8, wafer 9, baffle 10, nano-compensation stage 11, first sensor 12, second sensor 13, third sensor 14, first air bearing 15, second air bearing 16, third air bearing 17, vacuum chuck 18

DESCRIPTION OF THE PREFERRED EMBODIMENTS

In order to make the above objectives, features and advantages of the present disclosure more obvious and understandable, the specific embodiment of the present disclosure will be described in detail below with reference to the accompanying drawings. In the following description, many specific details are explained in order to fully understand the present disclosure. However, the present disclosure can be implemented in many other ways different from those described herein, and those skilled in the art can make similar improvements without departing from the spirit of the present disclosure. Therefore, the present disclosure is not limited by the specific embodiment disclosed below.

It should be understood that, in the disclosure of the present disclosure, orientations or positional relationships indicated by terms "central", "longitudinal", "transverse", "width", "thickness", "upper", "lower", "front", "rear", "left", "right", "vertical", "horizontal", "top", "bottom", "inner", "outer", "clockwise", "counterclockwise", "axial", "radial", "circumferential" and the like are the orientations and the positional relationships illustrated on the basis of the accompanying drawings, merely used for ease of describing the present disclosure and simplifying the description, rather than indicating or implying that the stated devices or elements must have a specific orientation or must be constructed and operated in a specific orientation. Thus, those terms shall not be interpreted as any limitation to the present disclosure.

In the present disclosure, the term "a" or "an" as used in the claims and description shall be interpreted as "one or more". That is, for a certain element, there may be one element in one embodiment, while there may be several elements in other embodiments. The term "a" or "an" shall not be interpreted as being unique or singular, unless the number of the element is explicitly indicated in the disclosure of the present disclosure. The term "a" or "an" shall not be interpreted as any limitation to the number.

In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include at least one of the features. In the description of the present disclosure, "plurality" means at least two, such as two, three, etc., unless otherwise specifically defined.

Please refer to FIG. 1-FIG. 7. This embodiment provides a high precision air bearing stage for wafer inspection, including: a base block 2, which can be used as a base during the wafer inspection process; a crossbeam 1, which is installed on the base block 1, as shown in FIG. 1. the crossbeam 1 is arranged in parallel, and it is roughly located at the center of the upper surface of the base block 2; The wafer 9 is placed on the vacuum chuck 18 which is located on the top of nano-compensation stage 11. The vacuum chuck 18 can reciprocate linearly with the air bearing stage. Grating ruler can detect the wafer position and provide feedback; the linear motor 7 is located on the inner wall side of the crossbeam 1, the linear motor 7 can drive the sliding table 8 to slide along the crossbeam 1; there are three sensors, which are distributed on the slide table 8. The three sensors are configured to detect the runout errors of the sliding table in real-time in measuring direction. For example, the measuring direction can be the vertical direction (Z direction in FIG. 1) of the air bearing stage; Air bearing consist of the first air bearing 15, the second air bearing 16 and the third air bearing 17. The first air bearing 15 and the second air bearing 16 are used for the horizontal constraint of the sliding table 8, the third air bearing 17 is used for the vertical support of the sliding table 8. Because the sliding table is supported and constrained by pressured air films, the stage has the characteristic of no friction. However, due to the influence of inherent factors such as the machining accuracy of the sliding surface, it is difficult to reduce the runout error of the traditional air bearing stage further. The new stage presented in this embodiment has the functions of runout error detection and compensation, so that the runout errors can be further reduced. The capacitive sensor measures the relative position change between sliding table and reference surface (a flat crystal) to obtain the runout error. The compensation stage 11 is located on the sliding table 8, which could provide real-time compensation of the runout errors for the air bearing stage.

Figure 2:
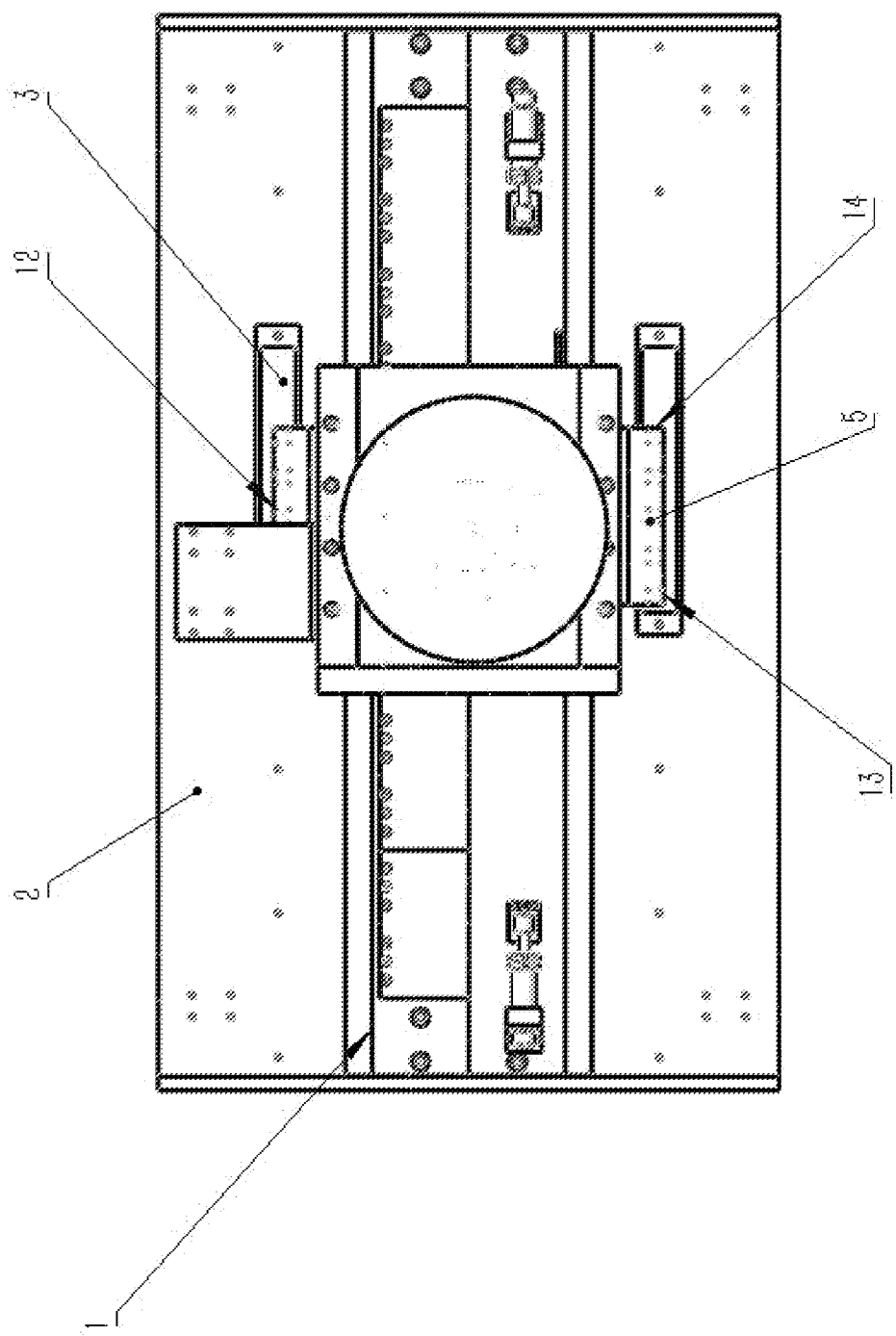
FIG. 2 is a top view of the air bearing stage according to an embodiment of the present invention.

Preferably, a high precision plane 3 is also included, which can be used as the reference plane of the run-out error detection. The sensor implements the detection of the runout errors of the air bearing stage by measuring the relative distance change between the high precision plane 3 and the capacitive sensor. The high precision plane 3 is a flat crystal, the flat crystal is installed on the flat crystal mounting seat 4, and the flat crystal mounting seat 4 is fixed on the base block 2, as shown in FIGS. 1 and 2. There are two groups of flat crystal and the flat crystal mounting seat 4, one of which is located on one side of the sliding table 8, and the other is located on the other side of the sliding table 8. The precision of the sensor can reach the nanometer level, and therefore the detection precision of the runout errors of the air bearing stage of the present invention can reach the nanometer level as well.

Figure 3:
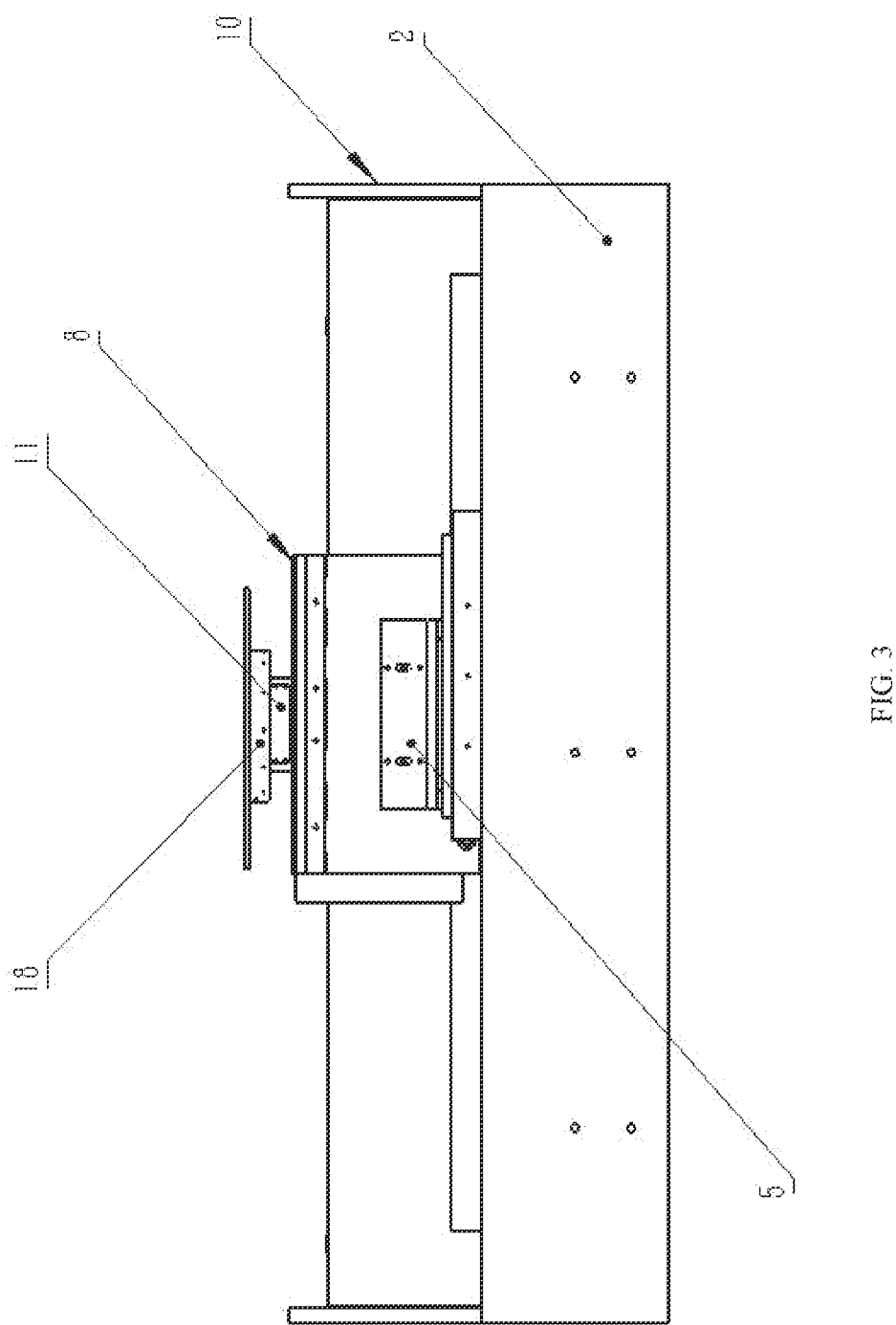
FIG. 3 is a front view of the air bearing stage according to an embodiment of the present invention.
Figure 6:
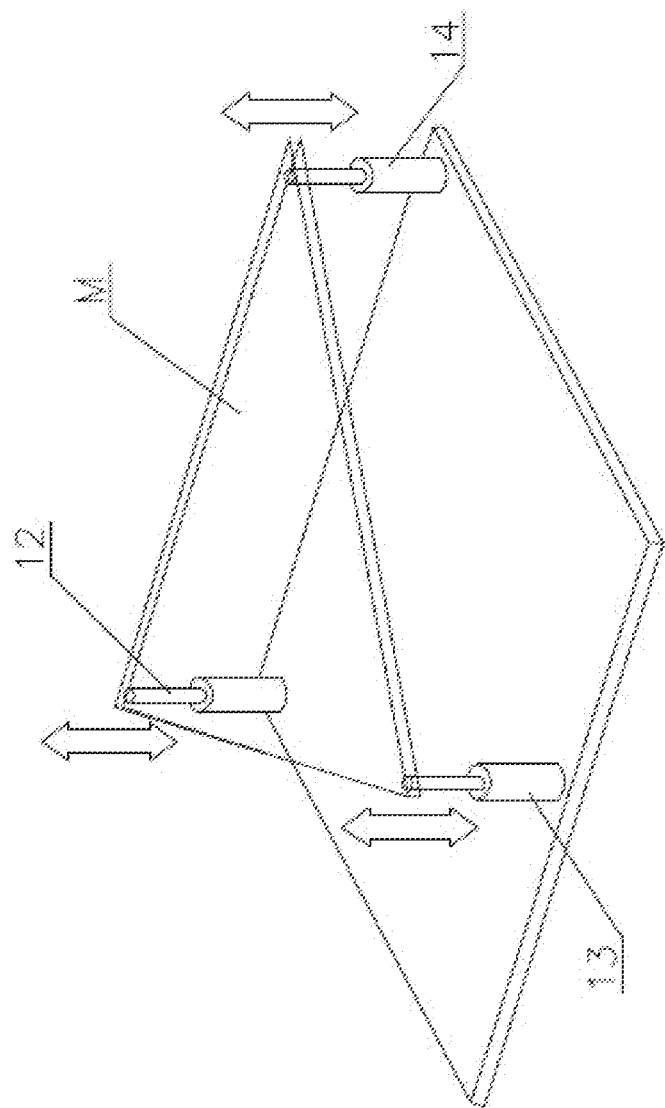
FIG. 6 is a schematic diagram of flatness detection by using three sensors in an embodiment of the present invention.
Figure 7:
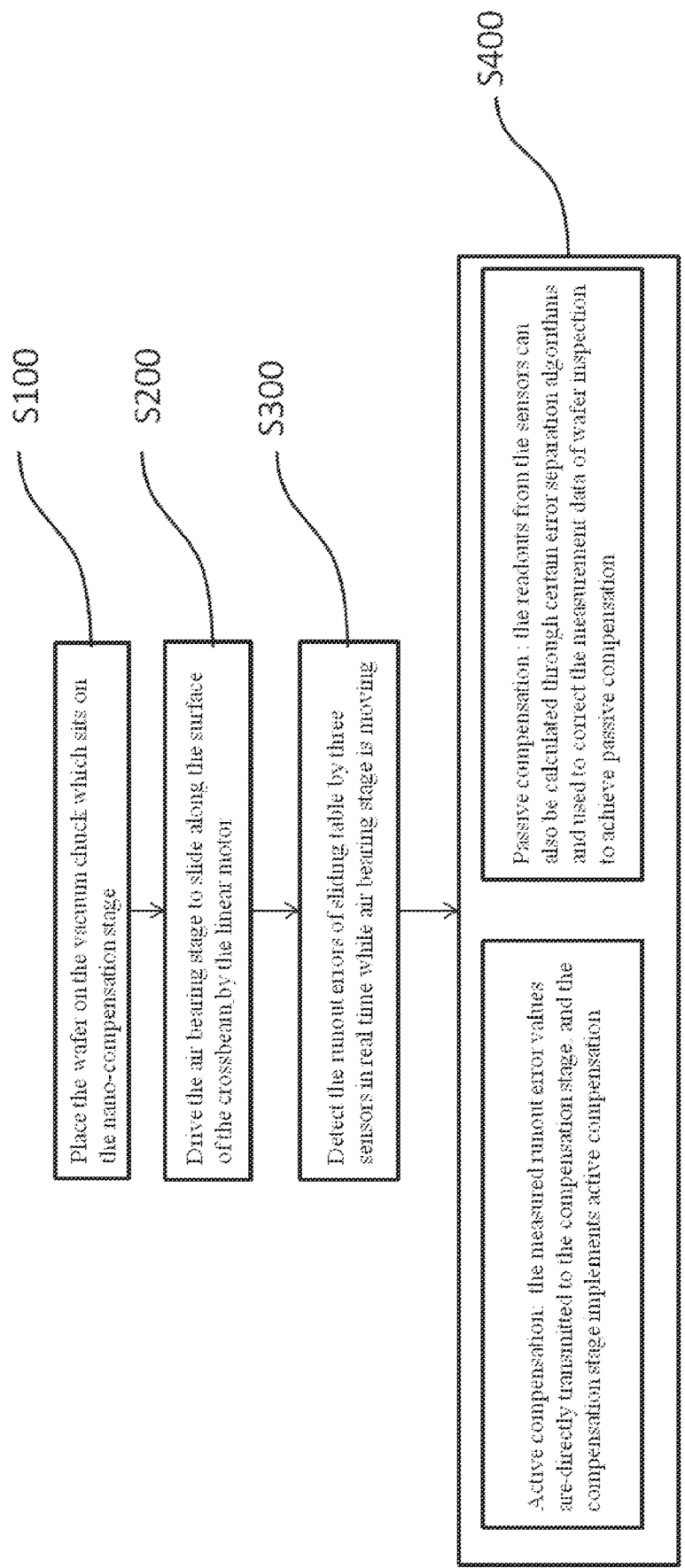
FIG. 7 is a flow chart of a method for runout error detection and compensation.
Figure 8:
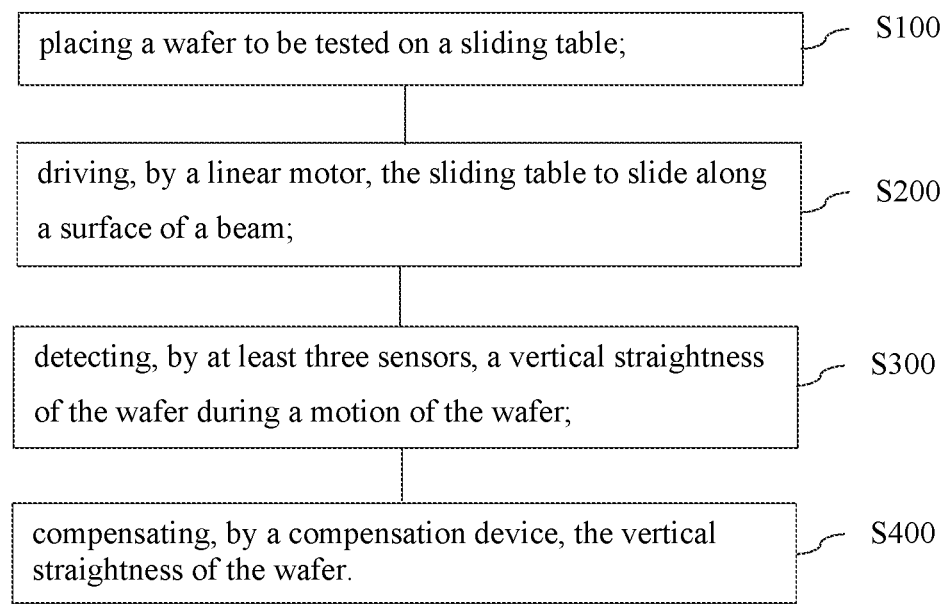

Please refer to FIG. 1 to FIG. 3, the air bearing stage in this embodiment further consists of sensor mounting bracket 5. There are two sensor mounting brackets 5, which are respectively fixed on both sides of the sliding table 8. In this embodiment, there are three sensors, including a first sensor 12, a second sensor 13 and a third sensor 14, the first sensor 12 is mounted on the sensor mounting brackets 5 on one side, the second sensor 13 and the third sensor 14 are jointly mounted on the sensor mounting bracket 5 on the other side. As shown in FIG. 6, the principle of three sensors for detecting the runout error is roughly as follows: Firstly, a plane M is estimated by the first sensor 12, the second sensor 13 and the third sensor 14, which can be used as the initial reference surface to determine wafer surface position. When the wafer 9 moves to different positions, the readouts of the first sensor 12, the second sensor 13 and the third sensor 14 will change. The data can be used to establish the current position of wafer 9. The height change of the wafer 9 can be calculated, then the runout error of any point on the wafer can be calculated through the error separation algorithm. In the invention, the sensor may be, for example, a capacitive sensor, an optical sensor, an inductive sensor, or the like.

A nano-compensation stage 11 is placed on the top of the sliding table 8, the wafer 9 is placed on the vacuum chuck 18 which is located on the nano-compensation stage 11. The wafer 9 can be moved in a straight line by the air bearing stage 8. The nano-compensation stage is driven by piezo actuators which have the characteristics of high bandwidth and high resolution. The air bearing stage in this embodiment also consists of a damper 6 and a baffle 10, as shown in FIG. 1. There are two baffles 10 and two dampers 6, which are located at the each ends of the crossbeam 1 respectively in pair. The baffle 10 is used as the end cover of the stage and the damper 6 is used hard stop of the sliding table 8.

Figure 4:
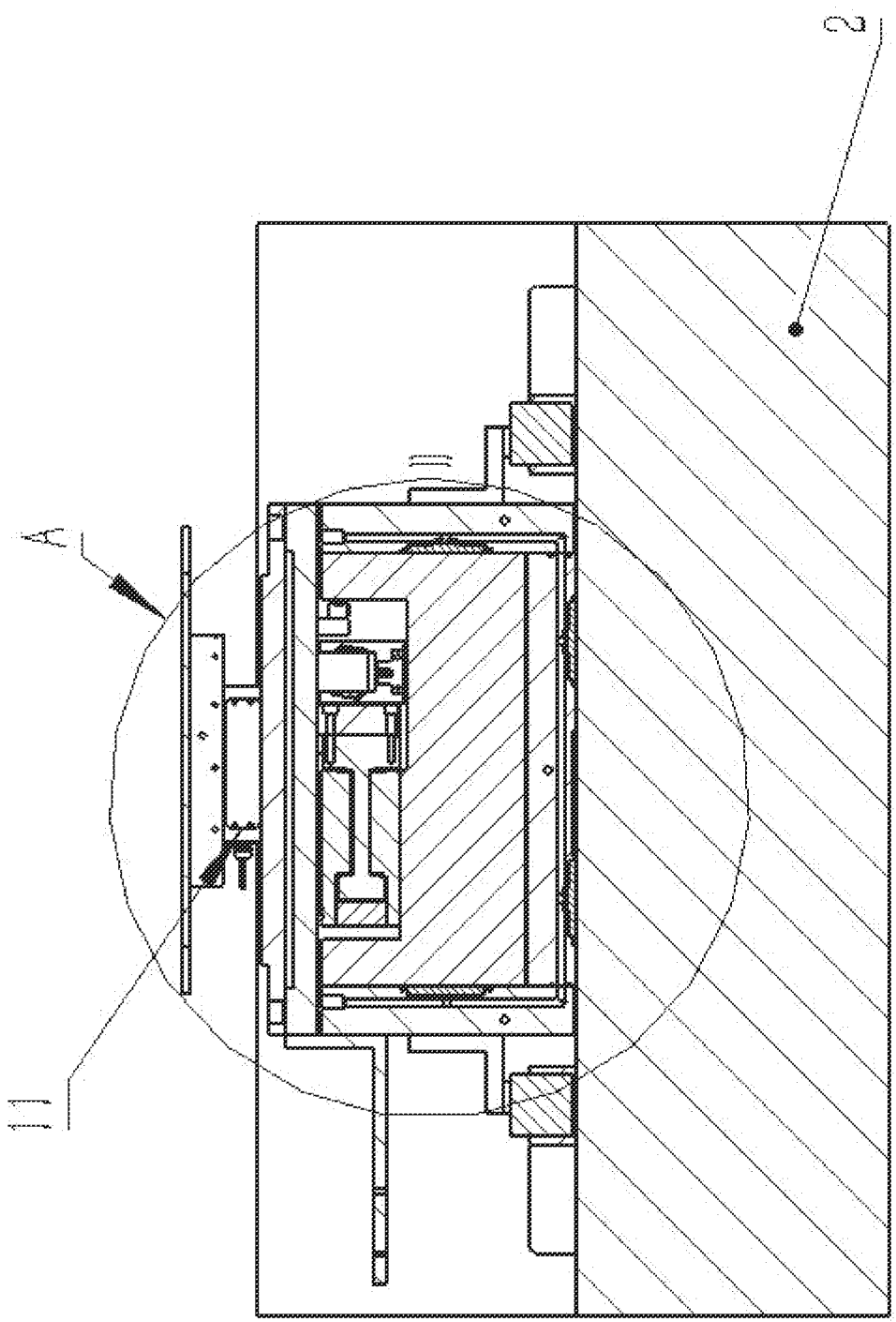
FIG. 4 is a cross-sectional view of the air bearing stage taken along a certain direction according to an embodiment of the present invention.
Figure 5:
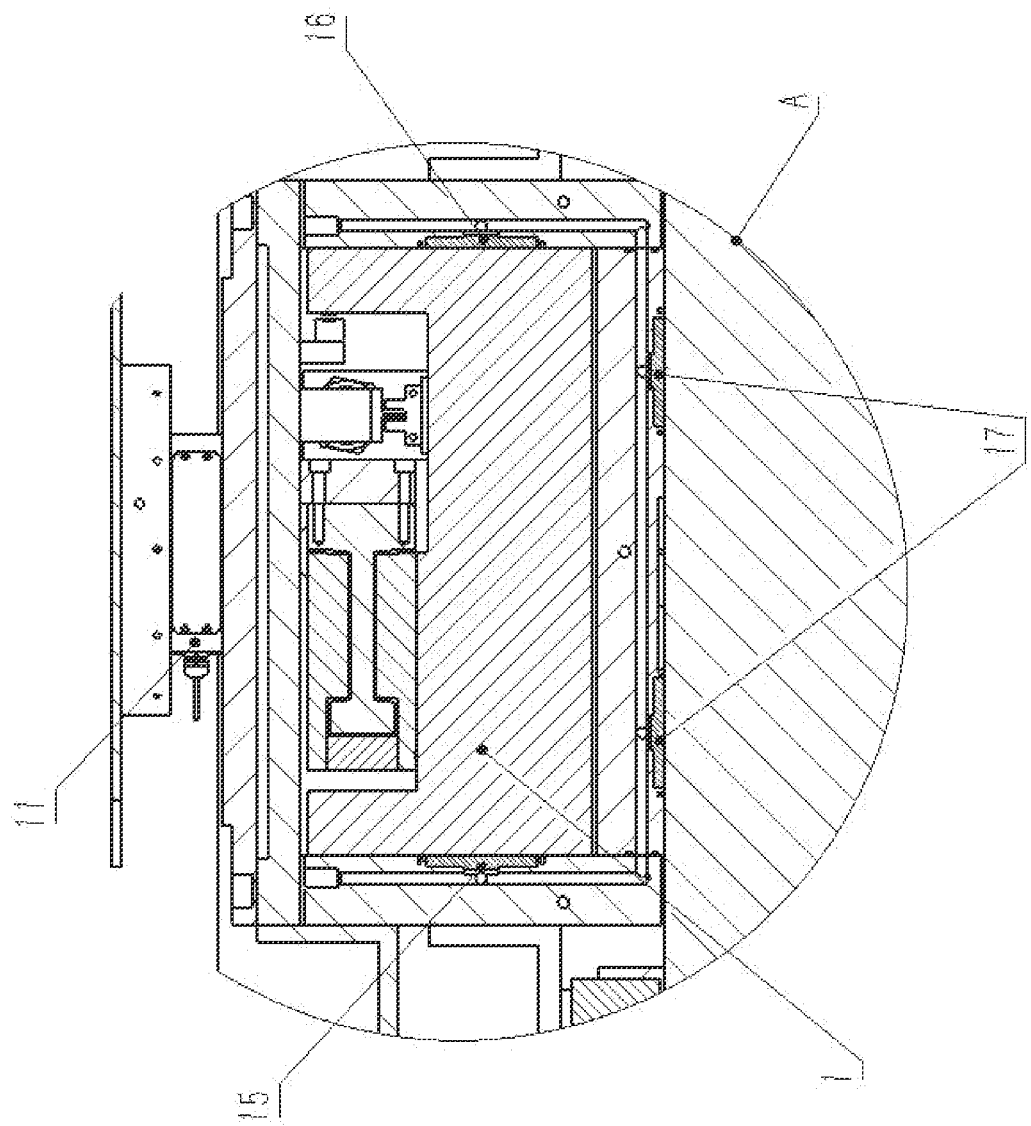
FIG. 5 is a partial enlarged view of part A in FIG. 4.

As shown in FIG. 4 and FIG. 5, the sliding table 8 is supported by air bearings. The air bearings include a first air bearing 15, a second air bearing 16 and a third air bearing 17. Specifically, the first air bearing 15 is located on the left side of the sliding table 8, which constrains the sliding table 8 from the left. The second air bearing 16 is located on the right side of the sliding table 8, which constrains the sliding table 8 from the right. The air bearing guiding surfaces of the first air bearing 15 and the second air bearing 16 face the surfaces of the side walls of the crossbeam 1, the first air bearing 15 and the second air bearing 16 are symmetrically preloaded to each other, and the air bearing guiding surface of the third air bearing 17 is the upper surface of the base block 2, the third air bearing can float up the sliding table 8. In this embodiment, the base block 2 is made of granite.

The present invention also provides a compensation method for the runout error of the air bearing stage during the wafer inspection process, comprising:

Step S100: place the wafer on the vacuum chuck which sits on the nano-compensation stage;

Step S200: drive the air bearing stage to slide along the surface of the crossbeam by the linear motor;

Step S300: detect the runout errors of sliding table by three sensors in real time while air bearing stage is moving.

Step S400: The measured runout error values are directly transmitted to the compensation stage, and the compensation stage implements active compensation. The readouts from the sensors can also be calculated through certain error separation algorithms and used to correct the measurement data of wafer inspection to achieve passive compensation.

In the above method, step S300 further includes: setting a high precision plane 3, and three sensors measuring the relative position change between the high precision plane 3 and sliding table, so as to detect the runout errors of the air bearing stage.

In step S400 two types of runout error compensation schemes are included, passive error compensation and active error compensation. In the embodiment of active error compensation, the nano-compensation stage 11 is driven by three piezo actuators, which are paired with capacitive sensors one by one respectively, forming a closed loop control. While the air bearing stage moves, the capacitive sensors measure the runout errors of the air bearing stage, and send the readouts directly to a controller. The controller drives the corresponding piezo actuators for error compensation. In this way the runout errors of the air bearing stage are actively compensated to eliminate the influence of runout error on wafer inspection. The air bearing stage and the detection method of the present invention can be applied to the XY planar air bearing stage as well.

The implementation process of passive compensation is roughly as follows: Firstly, record the outputs from the three capacitive sensors. Then, extract the runout errors of the air bearing stage from the recorded data, including the Z errors and pitch/roll errors. After that, convert those errors into the position error at the specific point on the wafer surface being inspected. Finally, the runout errors of the air bearing stage are compensated passively by removing those position errors from the measurement data of wafer inspection.

The present invention is not limited to the error measurement and compensation in the vertical direction. A reasonable arrangement of the transform capacitance sensor can be extended to the horizontal direction error detection and compensation.

The present invention detects the runout errors (vertical error, roll, pitch) of the air bearing online through three sensors with the nanometer-level precision. The runout errors of the air bearing stage can be compensated actively or passively.

The above examples only describe several embodiments of the present disclosure, and the descriptions are relatively specific and detailed. But they cannot be understood to limit the protection scope of the present disclosure. It should be pointed out that for those of ordinary skill in the art, without departing from the spirit of the present disclosure, several modifications and improvements can be made, and these all fall within the protection scope of the present disclosure. Therefore, the protection scope of the present disclosure should be subject to the appended claims.

The invention claimed is:

1. A high-precision air floating motion platform for wafer test, comprising:
   a base used as a seat in the wafer test process;
   a beam installed on the base;
   a sliding table capable of sliding along a surface of the beam, and a top of the sliding table being capable of carrying a wafer;
   a linear motor configured to drive the sliding table to slide along the beam;
   at least three sensors distributed on sides of the sliding table, and configured to detect a vertical straightness of the wafer;
   air bearings comprising a first air bearing, a second air bearing and a third air bearing; the first air bearing and the second air bearing being configured for a side limited suspension of the sliding table, and the third air bearing being configured for a bottom limited suspension of the sliding table; and a compensation device located above the sliding table, and the compensation device being configured to compensate the vertical straightness of the wafer based on a real-time data detected by the sensors.

2. The air floating motion platform of claim 1, further comprising a high-precision plane; wherein the high-precision plane is used as a reference plane for wafer flatness, and the sensors measure a change in position of the wafer with respect to the high-precision plane, such that a detection of the vertical straightness of the wafer is realized.

3. The air floating motion platform of claim 2, wherein the high-precision plane is an optical flat; the optical flat is mounted on a first mounting seat, and the first mounting seat is fixed on the base; the air floating motion platform comprises two sets of the optical flat and the first mounting seat; one set of the optical flat and the first mounting seat is located on one side of the sliding table, and an other set of the optical flat and the first mounting seat is located on an other side of the sliding table.

4. The air floating motion platform of claim 1, further comprising two second mounting seats; the two second mounting seats are respectively fixed on two sides of the sliding table; and the sensors comprise a first sensor, a second sensor and a third sensor; the first sensor is installed on one second mounting seat on one side of the sliding table, and the second sensor and the third sensor are both installed on another second mounting seat on an other side of the sliding table.

5. The air floating motion platform of claim 1, wherein a nano compensation motion platform is arranged on the top of the sliding table, the wafer is placed on the nano compensation motion platform, and the nano compensation motion platform is superimposed on the sliding table of the floating motion platform, the wafer is capable of moving linearly with the nano compensation motion platform.

6. The air floating motion platform of claim 1, further comprising two dampers and baffles; wherein the baffles are located on each side of the beam and is used to close the beam, and the two dampers are opposite arranged and respectively located a position close to an inner side of the baffle, and the two dampers are used to limit the motion track of the sliding table.

7. The air floating motion platform of claim 1, wherein the compensation device is a nano compensation table.

8. A wafer test method, comprising:
   S100: placing a wafer to be tested on a sliding table;
   S200: driving, by a linear motor, the sliding table to slide along a surface of a beam;
   S300: detecting, by at least three sensors, a vertical straightness of the wafer during a motion of the wafer;
   S400: compensating, by a compensation device, the vertical straightness of the wafer.

9. The method of claim 8, wherein the S300 further comprises: setting a high-precision plane, wherein a vertical runout of the air floating motion platform is measured by the sensors, such that a detection of the vertical straightness of the wafer is realized.

10. The method according to claim 8, wherein the compensation process in the S400 is:
   transmitting, by the sensors, a detected vertical straightness error signal of the sliding table to the compensation device; and
   adjusting, by the compensation device, a motion track of the sliding table to complete the compensation of the vertical straightness of the wafer.

* * * * *